(12) United States Patent
Hatano

(10) Patent No.: US 9,536,813 B2
(45) Date of Patent: *Jan. 3, 2017

(54) SEMICONDUCTOR DEVICE

(71) Applicant: RENESAS ELECTRONICS CORPORATION, Tokyo (JP)

(72) Inventor: Masato Hatano, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/868,852

(22) Filed: Sep. 29, 2015

(65) Prior Publication Data

US 2016/0020162 A1    Jan. 21, 2016

Related U.S. Application Data

(63) Continuation of application No. 14/519,438, filed on Oct. 21, 2014, now Pat. No. 9,165,868.

(30) Foreign Application Priority Data

Oct. 22, 2013 (JP) .................................. 2013-219595

(51) Int. Cl.
*H01L 23/495* (2006.01)
*H01L 23/00* (2006.01)

(52) U.S. Cl.
CPC ..... *H01L 23/49551* (2013.01); *H01L 23/4952* (2013.01); *H01L 23/49503* (2013.01); *H01L 23/49544* (2013.01); *H01L 23/49558* (2013.01); *H01L 24/97* (2013.01); *H01L 2224/32225* (2013.01); *H01L 2224/45144* (2013.01); *H01L 2224/48091* (2013.01); *H01L 2224/48227* (2013.01); *H01L 2224/48247* (2013.01); *H01L 2224/48465* (2013.01); *H01L 2224/73265* (2013.01); *H01L 2224/78301* (2013.01); *H01L 2224/83101* (2013.01);
(Continued)

(58) Field of Classification Search
CPC .................... H01L 23/49551; H01L 23/49503; H01L 23/4952; H01L 2224/32225; H01L 2224/48227; H01L 2924/00; H01L 2224/48465; H01L 2224/48247; H01L 2224/85181; H01L 2224/48091; H01L 2224/45144; H01L 2224/97; H01L 2224/73265; H01L 2924/181; H01L 2924/12042
See application file for complete search history.

(56) References Cited

U.S. PATENT DOCUMENTS 5,150,193 A     9/1992  Yasuhara et al.
6,424,023 B1    7/2002  Kim et al.
9,165,868 B2 *  10/2015 Hatano ............ H01L 23/49551

FOREIGN PATENT DOCUMENTS

JP           04-080931 A      3/1992

* cited by examiner

*Primary Examiner* — Roy Potter
(74) *Attorney, Agent, or Firm* — Mattingly & Malur, PC

(57) ABSTRACT

A semiconductor device includes: a semiconductor chip, and a lead frame. The semiconductor chip is mounted over a die pad. Four suspension leads are connected with the die pad and at least one of them is provided between first and second lead groups and is deformed to protrude toward the first lead group. At least one of the leads of the second lead group which is nearer to the deformed suspension lead is deformed to be apart from remaining leads of the second lead group.

7 Claims, 10 Drawing Sheets

(52) U.S. Cl.
CPC  *H01L 2224/85181* (2013.01); *H01L 2224/97* (2013.01); *H01L 2924/12042* (2013.01); *H01L 2924/181* (2013.01)

SEMICONDUCTOR DEVICE

CROSS-REFERENCE

This application claims a priority on convention based on Japanese Patent Application No. JP 2013-219595. The disclosure thereof is incorporated herein by reference.

TECHNICAL FIELD

The present invention is related to a semiconductor device and especially to a designed lead frame and a semiconductor device having the same.

BACKGROUND ART

In case of designing a lead frame for a semiconductor device so as to decrease kinds of lead frames, the structure of a semiconductor chip is basically adjusted in the design of the semiconductor chip so that the chip can be mounted on an existing lead frame. However, there is a case that the chip cannot be mounted on the existing lead frame, when one chip is applied to a few packages or when there is a product constraint.

When the chip is mounted above the existing lead frame and a wire bonding step is carried out, there is a risk that a wire interval becomes very narrow in a specific portion so that adjacent wires contact each other to form a short circuit, if the mount position of the chip is shifted or the wires are eccentrically-located. For this reason, the structure of the lead frame needs to be deformed.

As related techniques, Patent Literature 1 (JP H04-80931A) discloses a semiconductor device in which a tab suspension lead is deformed into an arrangement direction of inner leads.

CITATION LIST

[Patent Literature 1] JP H04-80931A

SUMMARY OF THE INVENTION

When a series of new products of the semiconductor device are supplied to a market, there is a case that a semiconductor chip is used in common. In such a case, if a lead frame can be used in common, it is favorable from a view of a cost. However, when the chip design is already ended so that a product specification is fixed, the arrangement of bonding wires is already determined. Thus, the movement and change of pads (electrodes) are impossible. Therefore, when a new type of product should be supplied, a lead frame needs to be newly designed according to the specification of the chip.

For example, in a microcomputer package having the number of pins from 20 to 128, there is a case that the lead frame of a usual structure cannot cope with many types of packages of one chip.

Therefore, a technique is proposed in which the shapes of a tab suspension lead and an inner lead are changed to be possible to correctly carry out the wire bonding between the chip and the inner leads.

In a semiconductor device in which a wire lead group is arranged to each of four sides of a semiconductor chip, one of the wire leads of one of the two wire lead groups on both sides of at least one of four suspension leads connected with the four corners of a die pad and one of pads on one of the four sides corresponding to the other wire lead group are connected by a wire.

The semiconductor chip can be mounted above the lead frame without being anxious about generation of a short circuit between wires, even when one chip is applied to a few packages or when there is a product constraint.

DESCRIPTION OF THE EMBODIMENTS

A semiconductor device using a lead frame according to embodiments will be described with reference to the attached drawings.

As packages of the semiconductor device according to an embodiment, QFP (Quad Flat Package) and QFN (Quad Flat Non-Leaded Package) of a surface mount type packages are assumed. However, actually, the present invention is not limited to these examples. For example, the package may be of a similar type (QFP package and QFN package). The surface mount type packages are developed to respond requests of the small size, thin shape and high function of an electronic device, and leads are formed in parallel to a chip surface or along the sides of the chip. In the QFP package, the leads extend from four sides of the package to have a gull wing shape (L-like shape). In the QFN package, pads (electrodes) are present in a bottom surface of the four sides of the package but there is no lead.

For example, when one chip is applied to a few packages or there is a product constraint, there is a case that the chip can be mounted over a current lead frame for other packages other than QFP and QFN packages, but the chip cannot be mounted on the lead frame for the QFP and QFN packages.

Therefore, in the present embodiment, the shape of a new lead frame over which the chip can be mounted in the QFP and QFN packages is disclosed so as to cope with the above-mentioned situation.

A structure example of a semiconductor device according to an embodiment will be described with reference to FIG. 1.

Figure 9:
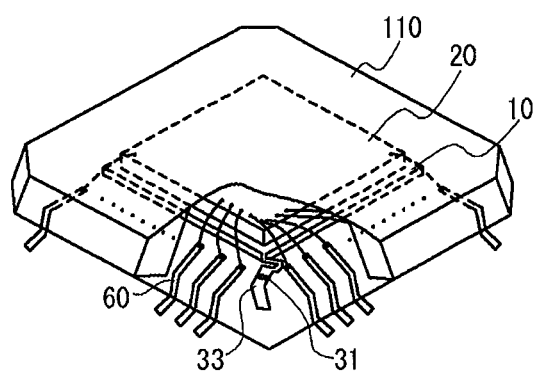
FIG. 9 is a partially exposed perspective view of the semiconductor device according to the embodiment.

The semiconductor device according to the present embodiment is provided with a chip 20, a lead frame 100 and a resin package 110 (FIG. 9). The lead frame 100 is composed of a die pad 10, suspension leads 30, inner leads 40, outer leads 60, a tie bar 70 and a tape 50.

The die pad 10 is a pad provided in the center of the rectangular lead frame and having a rectangle shape to mount the chip 20.

The chip 20 is a semiconductor integrated circuit (IC, LSI) to be mounted, and has a rectangular shape basically, and is mounted over the die pad 10 through Ag paste and so on. The chip 20 may be deformed from the rectangle due to an error when the chip (die) is cut out from a wafer. The chip 20 has groups of pads which are arranged along four sides of the rectangular chip 20.

The suspension leads 30 are a member to be connected with each of the four corners of the rectangular die pad 10 to support the die pad 10. Before the resin sealing, the four suspension leads 30 connect the four corners of the lead frame 100 and the four corners of the die pad 10. However, after the resin sealing, there is no suspension lead outside the package 110.

Note that the shape of the suspension lead 30 is determined in consideration of the stress when the lead frame is sealed with resin (mold resin). That is, the suspension lead 30 has a connection section 31 provided for a connection portion with each corner of the die pad 10. The connection section 31 is formed to have a thinner/narrower lead than the other portion of the suspension lead 30 in FIG. 1, and is formed to have an S-like shape or a crank shape which is bent at a right angle. Actually, the lead may be bent gently not at the right angle but in a circular curve. Next, the suspension lead 30 has a descent section 32. The die pad 10 is located in a lower position due to the descent sections 32 of the suspension leads 30, as compared with a case where the descent section 32 is not provided. The descent section 32 is inclined and may be sloped or may be perpendicularly bent. Note that the connection section 31 and the descent section 32 may be unified. That is, even if torsional stress is generated due to a displacement of the suspension lead in a horizontal direction and a rotational displacement around the direction of the center of the suspension lead 30 or a direction parallel to the central direction, the torsional stress can be absorbed because the connection section 31 is formed. Also, the connection section 31 may be inclined together with the descent section 32. Even if the motion of the die pad in up and down directions occurs, the motion can be absorbed by the descent section 32. Also, it is possible to lower a position of lead frame 100 to that of the inner leads 40 by the descent section 32 and it is possible to contribute to a thin structure of the semiconductor device.

Generally, the suspension leads 30 are arranged to extend from the die pad 10 into external directions on virtual diagonal lines (diagonal lines drawn virtually) of the die pad 10. In a first structure example of the present embodiment shown in FIG. 1, one of the four suspension leads 30 is deformed, while three of the four suspension leads 30 connected with the four corners of the die pad 10 are not deformed. At least, the deformed suspension lead 30 differs in the shape from the remaining three suspension leads 30 which are not deformed. In FIG. 1, the deformed suspension lead 30 has a bent section 33 bent to protrude in a clockwise direction with respect to the virtual diagonal lines in a top view. The deformed suspension lead 30 is arranged to step out of the virtual diagonal line of the die pad 10 and to protrude toward the first inner lead group. However, the deformed suspension lead 30 may be bent to protrude to the counter-clockwise direction. A plurality of inner leads 40 corresponding to each of the four sides of the rectangular die pad 10 or chip 20 are arranged inside the lead frame and the four inner lead groups are formed.

It is supposed that there are first and second inner lead groups adjacent to the deformed suspension lead 30 on the both sides of the deformed suspension lead 30. Also, the die pad 10 has first and second sides respectively corresponding to the first and second inner lead groups. Furthermore, it is supposed that the suspension lead 30 has the bent section 33 protruding to the direction of the first inner lead group.

Figure 1:
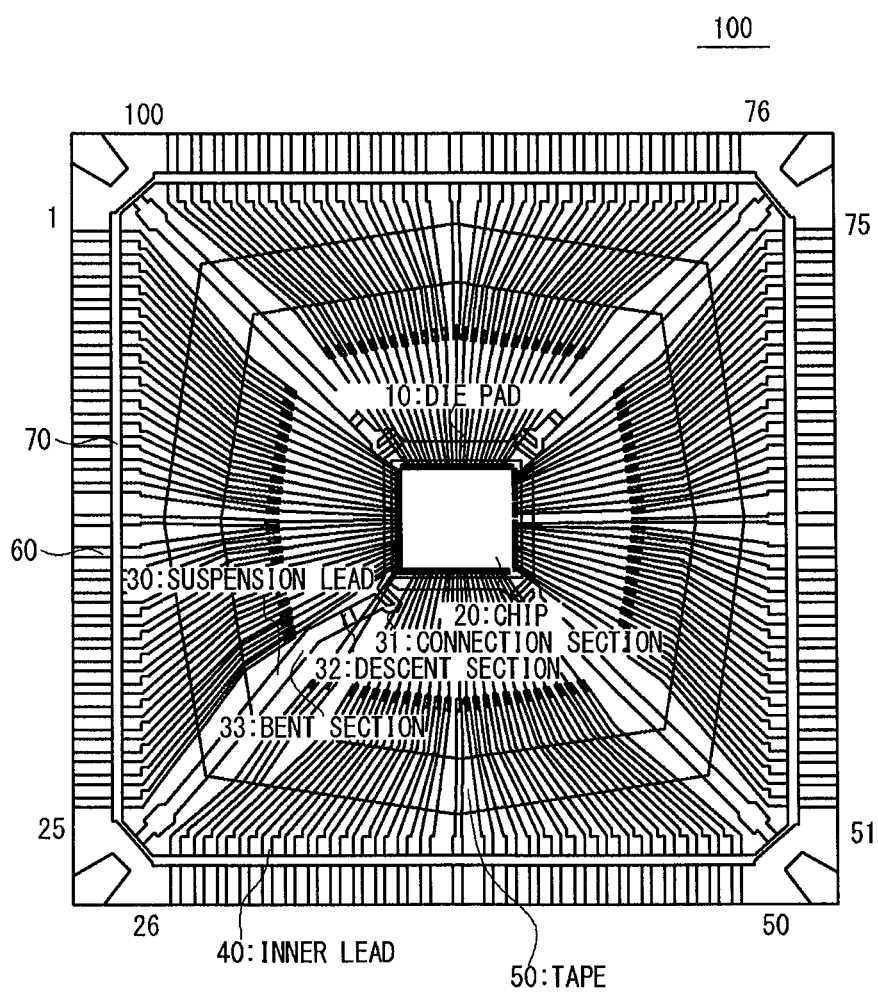
FIG. 1 is a diagram showing a first structure example of a lead frame used in a semiconductor device according to an embodiment.

In FIG. 1, the plurality of inner leads 40 corresponding to each of the four sides of the rectangular die pad 10 or chip 20 are arranged inside the lead frame and the four lead groups are formed. In FIG. 1, a package of 100 pins is exemplified and 25 pins are arranged in each side. On the other hand, in the first side of the die pad 10 or chip 20, the number of pads which are formed along the first side of the chip 20 is greater than the number of inner leads of the first side (in this example, greater by two). The inner lead group is formed on an identical plane and the outer portion from the descent section 32 of the suspension lead 30 is formed on the same plane as the inner lead group. In this example, the area where the inner lead group exists is narrowed toward the die pad 10 in two steps and the inner lead group is opposite to the corresponding side of the chip 20. The tip of inner lead in the center of the corresponding side of the chip 20 is designed to be farthest from the chip 20 among the inner leads and the tips of the inner leads in the both ends of the inner lead group are designed to be nearer to the chip 20. As a result, the inner lead group is apart from the non-deformed suspension leads 30 to have a wide space. Therefore, the inner leads 40 and the suspension lead 30 do not overlap and do not touch. Especially, the inner leads 40 are widely apart from the suspension lead 30 in the state narrowed in the one narrowing step. Note that the inner lead group is narrowed in the two steps, but it may be narrowed in the one step and may be not narrowed. Therefore, the suspension lead 30 becomes possible to be deformed to the direction of the first side, as described above.

Generally, the tip of one inner lead 40 among the second inner lead group is connected with one of the pads (not shown) along the second side of the chip 20 by a bonding wire. However, in the present embodiment, at least one inner lead 40 near to the deformed suspension lead 30 among the inner leads 40 of the second inner lead group is deformed to get near to the deformed suspension lead 30 in the top view. The deformed inner lead 40 is determined based on the arrangement of pads along the first side in the chip 20. Thus, the tip of the at least one deformed inner lead 40 of the second inner lead group is connected with the pad along the first side. The pad is arranged to be nearer to the second side. When the number of deformed inner leads is two, the tips of the two deformed inner leads 40 of the second inner leads and the two pads on the first side of the chip 20 on the left side of the deformed inner leads can be connected by the bonding wires, respectively. It is desirable that the above two bonding pads are arranged in the neighborhood of the deformed inner leads 40 as nearer as possible. Note that when the shape of inner lead 40 is changed, the inner lead 40 is adjusted to meet the inter-wire distance of 55 •m or above in the REL standard. Also, note that the positions of the four sides inside the lead frame are fixed, because the positions of the outer leads are determined depending on the package.

The outer leads 60 are formed in correspondence to the inner leads 40. A tie bar 70 is formed between the inner leads 40 and the outer leads 60. Thus, the inner leads 40 and the outer leads 60 are supported. This tie bar 70 is cut after resin sealing. Thus, the inner leads 40 and the outer leads 60 become independent and never form a short circuit. Also, the suspension leads 30 do not appear out of the resin package.

The wire bonding is made possible without being anxious about generation of a short circuit by a bonding wire so that chips 20 having different pad arrangements can be mounted, by using a free space between the deformed suspension lead 30 and the inner leads of the second inner lead group to deform the inner leads 40.

Also, a tape 50 is used on the back side of the lead frame 100 (on the side opposite to the chip 20) to fix the inner lead groups on their way in an extending direction so that the inner leads 40 do not become independent in the manufacturing process of the semiconductor device. The tape 50 has a size which can cover the four lead groups to collectively fix the four lead groups and has an opening in the center portion. The tape may be peeled off after the wire bonding and may be just as it is if this tape 50 is insulative. In FIG. 1, the tape 50 has a ring-like shape (a ring tape). In the conventional method in which the tape 50 is used to each inner lead group, the deformed inner leads 40 which are not fixed exist in the neighborhood of the suspension lead 30.

For example, it is supposed that a lead frame having tape fixation areas in the suspension leads 30 of the four corners is adopted, and the inner leads 40 are fixed for every lead group by using the tape, as in the conventional method. In this case, the fixation of the deformed inner lead 40 is insufficiency to occur the bonding failure. Therefore, in the present embodiment, in order to fix the deformed inner leads 40, the ring-shaped tape 50 is adopted. The ring-shaped tape 50 collectively fixes the four inner lead groups arranged in four sides of the lead frame. The deformed inner leads 40 are fixed by the ring-shaped tape 50 on the position apart from the positions where the inner leads 40 are the wire bonded. Thus, the tape fixation areas of the suspension leads 30 became unnecessary so that the areas can be reduced.

(Structure Example of Deformation of Suspension Lead)

The structure examples of deformation of the suspension leads in the present embodiment will be described with reference to FIG. 2 to FIG. 5.

FIG. 1 shows the first structure example in which one of the four suspension leads 30 is deformed. In this case, the suspension lead 30 connected to one of the four corners of the rectangular lead frame is deformed.

Figure 2:
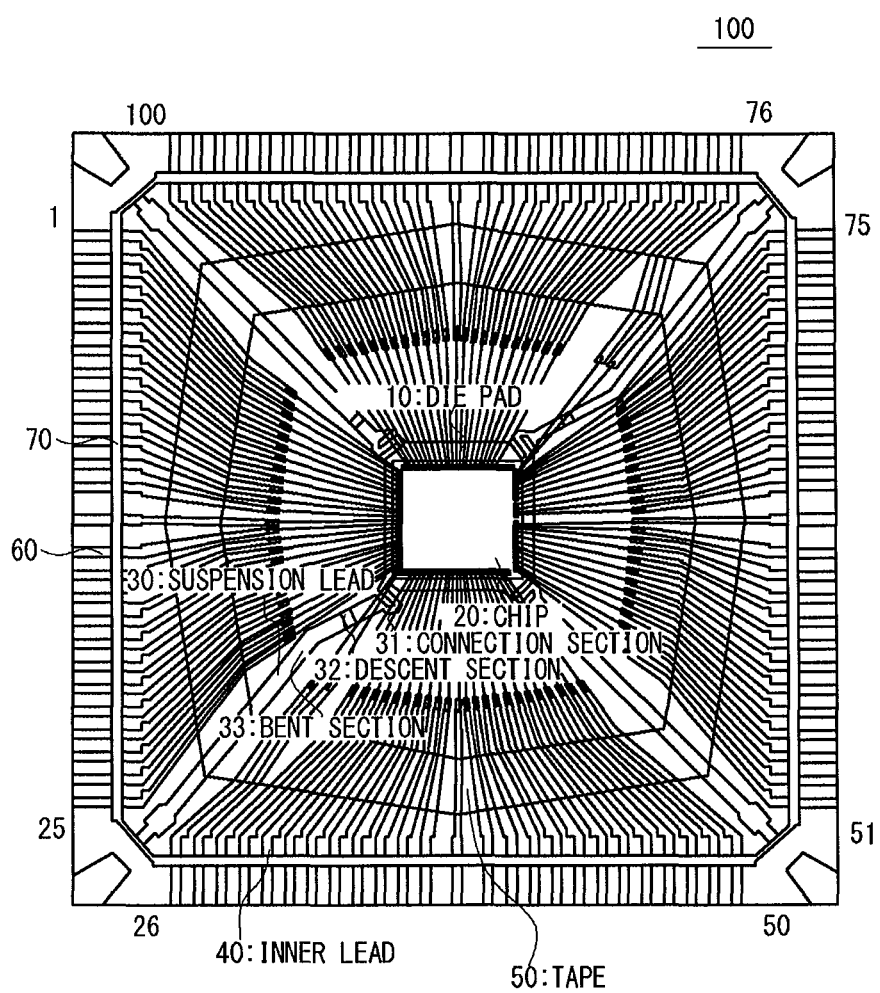
FIG. 2 is a diagram showing a second structure example of the lead frame used in the semiconductor device according to the embodiment.

FIG. 2 shows a second structure example in which two of the four suspension leads 30 are deformed. In this case, two of the four suspension leads 30 which are on one of diagonal lines of the rectangular lead frame are deformed.

Figure 3:
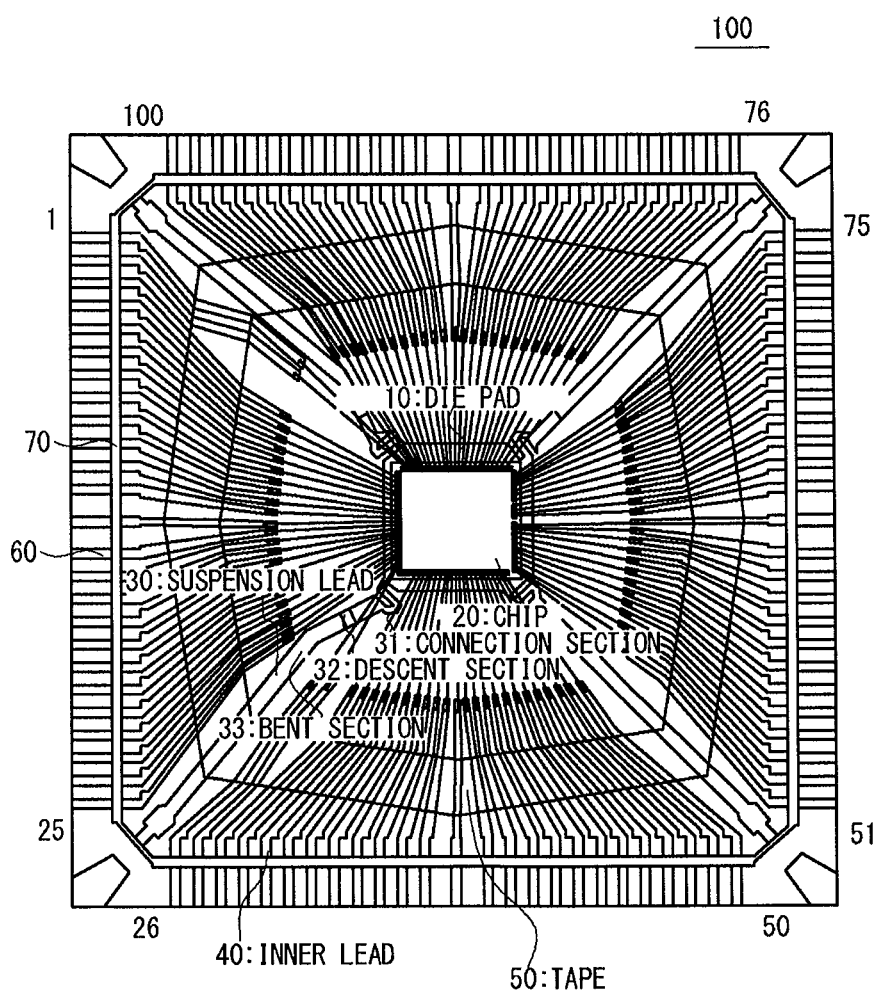
FIG. 3 is a diagram showing a third structure example of the lead frame used in the semiconductor device according to the embodiment.

FIG. 3 shows a third structure example in which two of the four suspension leads 30 are deformed. In this case, adjacent two of the four suspension leads 30 of the rectangular lead frame are deformed.

Figure 4:
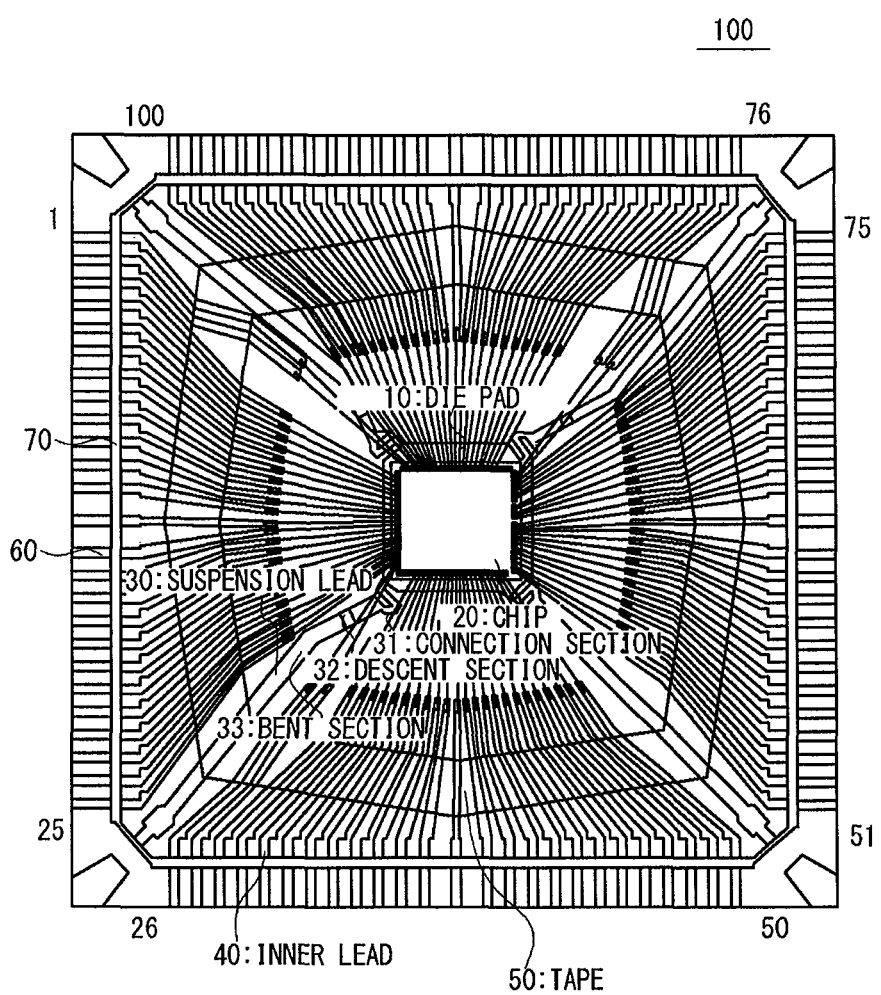
FIG. 4 is a diagram showing a fourth structure example of the lead frame used in the semiconductor device according to the embodiment.

FIG. 4 shows a fourth structure example in which three of the four suspension leads 30 are deformed. In this case, three of the four suspension leads 30 which are connected to three of the four corners of the rectangular lead frame are deformed.

Figure 5:
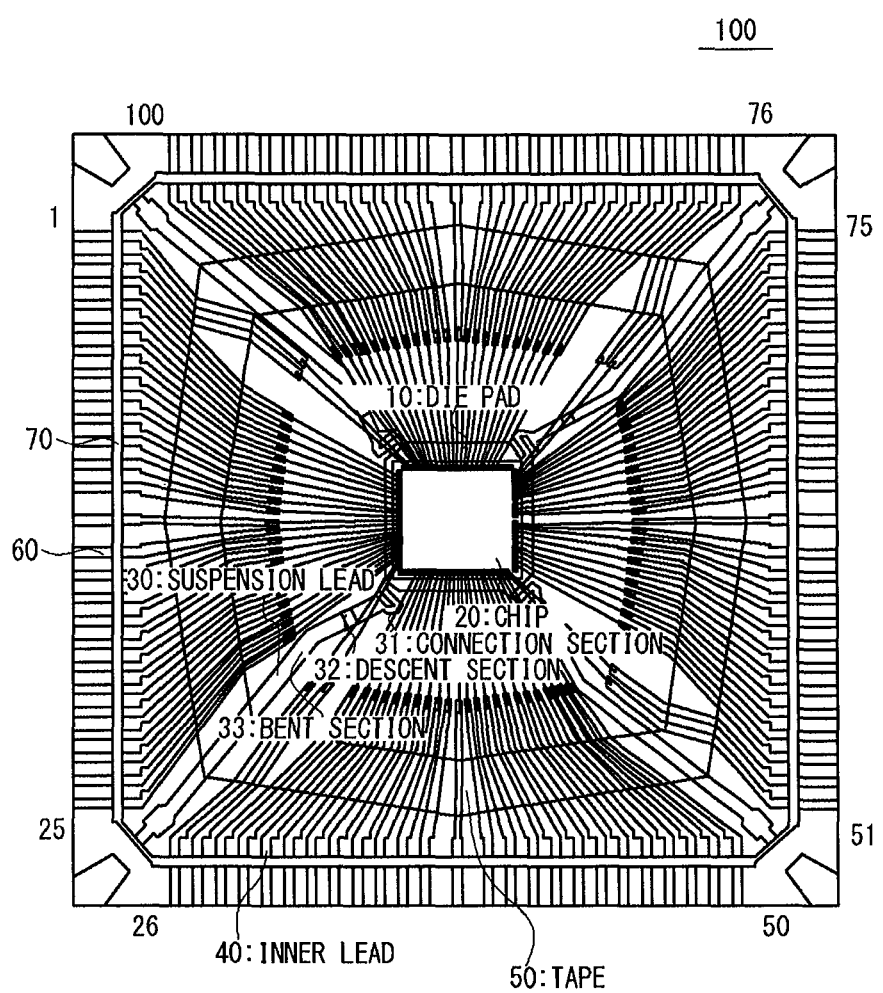
FIG. 5 is a diagram showing a fifth structure example of the lead frame used in the semiconductor device according to the embodiment.

FIG. 5 shows a fifth structure example in which four of the four suspension leads 30 are all deformed. In this case, all of the four suspension leads 30 connected to the four corners of the rectangular lead frame are deformed.

However, actually, the present invention is not limited to the above deformation pattern examples. Also, the bending direction of the suspension lead and the shape of the deformed suspension lead may be not identical to all the suspension leads and may be optional over the deformed suspension leads.

Figure 6A:
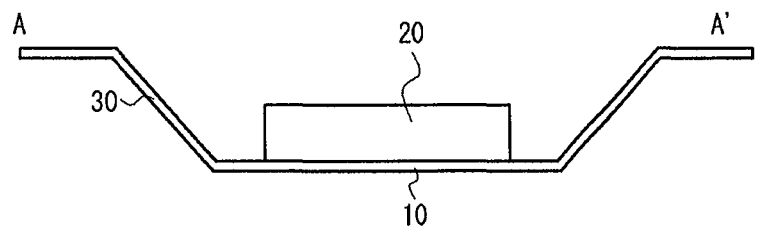
FIG. 6A is a sectional view of the semiconductor device according to the embodiment along a non-deformed suspension lead.
Figure 6B:
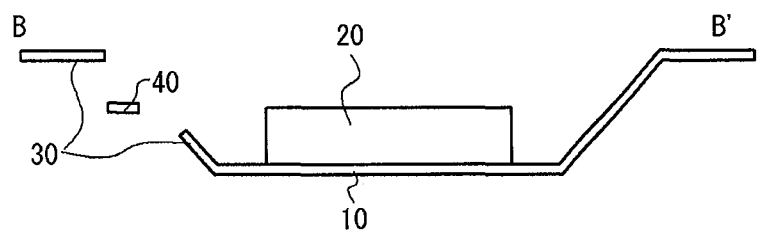
FIG. 6B is a sectional view of the semiconductor device according to the embodiment along a deformed suspension lead.

A sectional view of the lead frame on the diagonal line when the one suspension lead is deformed (FIG. 1) will be described with reference to FIG. 6A to FIG. 6C.

Figure 6C:
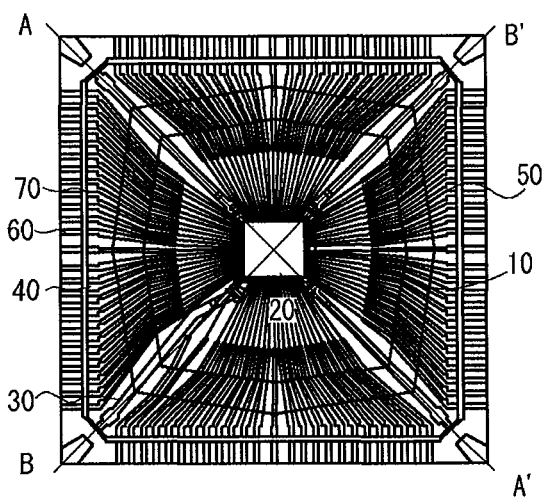
FIG. 6C is a plan view of a lead frame used in the embodiment.

FIG. 6C is a top view showing the lead frame when the one suspension lead is deformed. FIG. 6A is a sectional view showing a section (A-A') of the semiconductor device on the diagonal line of the lead frame which does not pass on the deformed suspension lead. FIG. 6B is a sectional view showing a section (B-B') of the semiconductor device on the diagonal line of the lead frame which passes on the deformed suspension lead. The section (A-A') shows the usual section of the lead frame on the diagonal line. The section (B-B') differs mainly from the section (A-A') in the point that a part of the deformed inner lead 40 exists in a free space produced through the deformed suspension lead 30 on the diagonal line of the lead frame. Note that the inner lead 40 does not always exist and sometimes exists depending on the design. Also, the slope part of the suspension lead 30 shows that the descent section 32 between the connection section 31 of the suspension lead 30 and the corner of the die pad 10 is descended lower from the other part.

Figure 7:
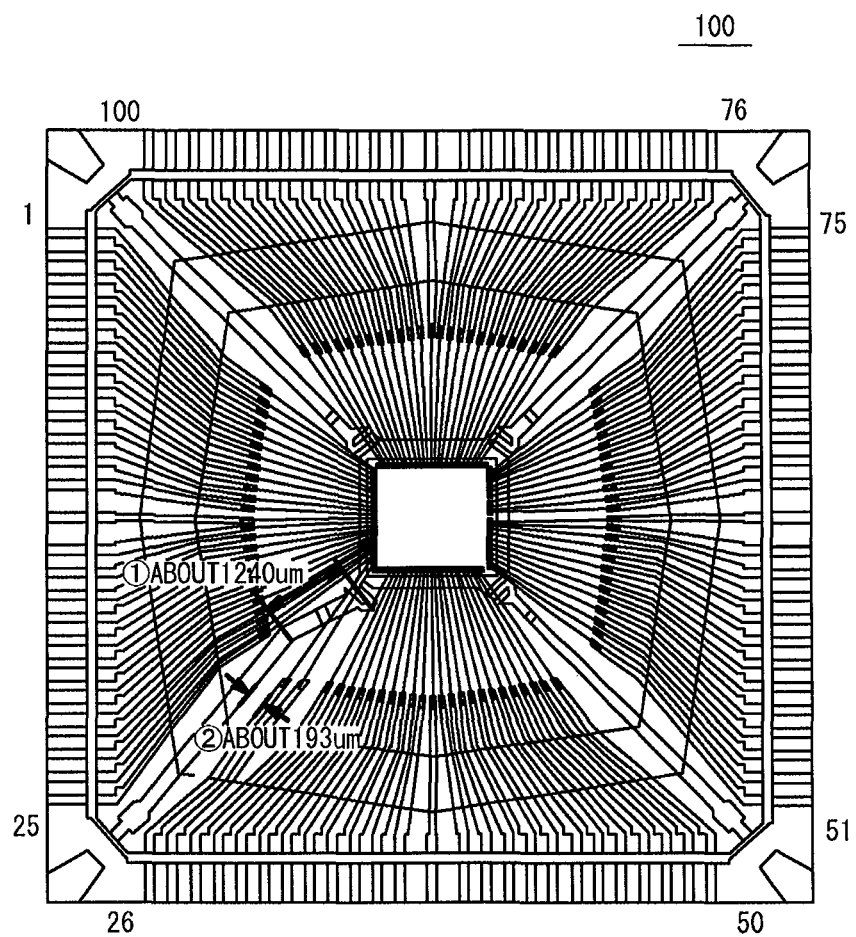
FIG. 7 is a diagram showing a distance between a suspension lead and an inner lead in the semiconductor device of the embodiment.

An example of a distance between the suspension lead and the inner lead in the present embodiment will be described with reference to FIG. 7.

In the suspension leads 30, a distance (length) between the bent section 33 and the connection section 31 is supposed to be about 1240 •m at least. A distance (interval) between the suspension lead 30 and the inner lead 40 is supposed to be about 193 •m at least. Also, a DP quantity is supposed to be about 100 •m. However, actually, the present invention is not limited to these values.

Figure 8A:
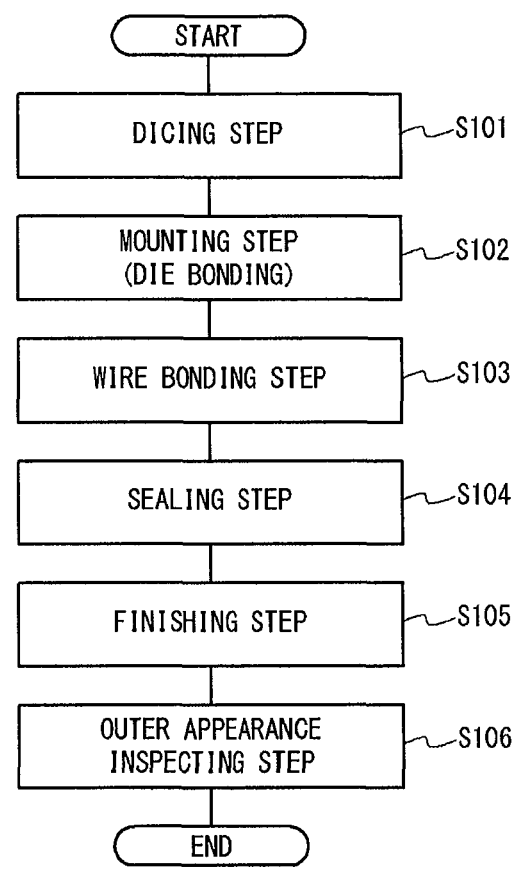
FIG. 8A is a flow chart showing an assembly process of the semiconductor device according to the embodiment.
Figure 8B:
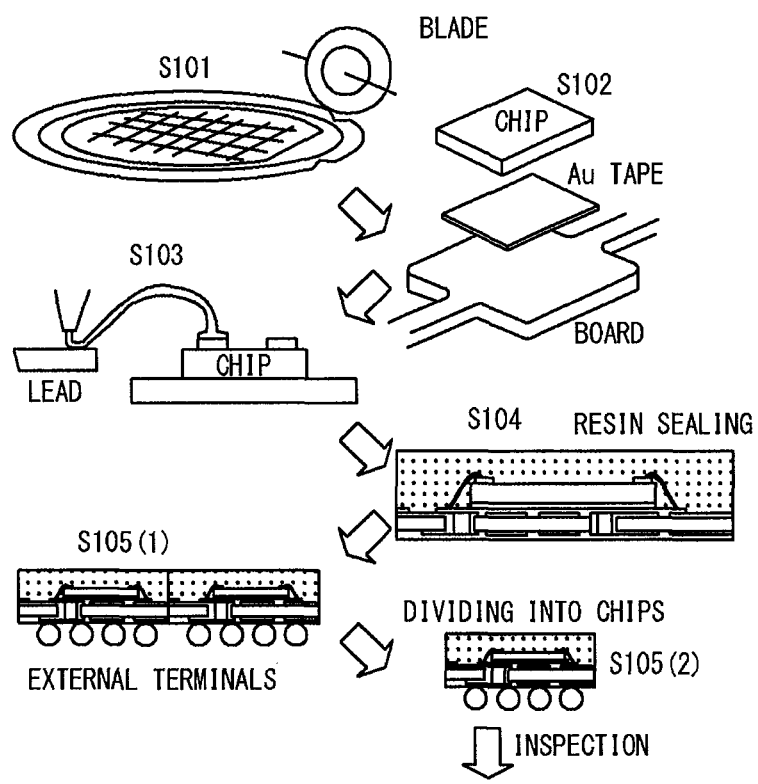
FIG. 8B is a diagram showing the assembly process of the semiconductor device according to the embodiment.

An assembling process (packaging process) of the semiconductor device according to the present embodiment will be described with reference to FIG. 8A. Note that the following steps are performed by units or devices for the steps, as shown in FIG. 8B.

(1) Step S101

First, a dicing step is carried out. Here, a semiconductor wafer is cut with a blade. Many devices have been formed on the semiconductor wafer in a lattice. Through the dicing step, the semiconductor wafer on which the devices have been formed is divided for every device to form semiconductor chips. As an example of a dicing method, there are known a dicing method using a rotary dicing saw and a scribe method using a diamond cutter or a laser beam. Thus, each of the many devices formed on the semiconductor wafer in a lattice is individually cut off.

At this time, each chip is cut down to have a rectangular shape basically. However, there is a case that the chip does not have a correct rectangular shape because of an error of the dicing unit. Also, the corner of the semiconductor chip breaks so that the shape is not correctly rectangular. In the present invention, the word of "rectangle" is used in the Specification and the Claims, including such cases. Thus, even if the shape of the chip is different from the correct rectangle, the chip shape which a person skilled in the art considers to be rectangular is referred to as a "rectangular chip".

(2) Step S102

Next, a mount step (die bonding step) is carried out. Here, the chip 20 is mounted and positioned on an AU tape, and is adhered above the lead frame or a substrate. In this case, the chip 20 may be adhered with Ag paste. Note that solder and die bonding resin paste are sometimes used as glue in the die bonding method in order to fixedly couple the chip to the lead frame or the substrate. In the present embodiment, at least one of the four suspension leads 30 which support the die pad 10 of the lead frame is deformed.

(3) Step S103

Next, a bonding step (wire bonding step) is carried out. Here, electrode pads are arranged along each of the four sides of the chip 20 and the electrode pad of the chip 20 and the tip portion of each inner lead 40 of the lead frame are connected by a gold wire. In the present embodiment, because the shape of inner lead 40 is deformable, it is possible to secure a wire interval sufficiently in the four corners of the chip 20 where the wires are easy to crowd. Also, without being anxious about a contact of the neighboring wires to form a short circuit, the electrode pad of the chip 20 and the inner lead 40 can be electrically connected by the gold wire.

(4) Step S104

Next, a sealing step (molding step) is carried out. Here, in order to protect the chip and the gold wire from external stress, moisture and contamination substance, the resin (mold resin) sealing step is carried out. Note that in each suspension lead 30 of the present embodiment, the connection section 31 with the corner of the die pad 10 is descended lower than the other part of the lead frame by the descent section 32 in consideration of the stress when sealing resin is injected. Also, although this connection section 31 becomes thinner than the other part, the connection section 31 can dynamically endure the stress when the mold resin is injected, by forming it to have a characteristic shape (S-character shape, or crank shape) as shown in FIGS. 1 to 5.

(5) Step S105

Next, a finishing step is carried out. Here, (i) outer terminals (outer leads) are shaped to have a predetermined shape according to the package. Also, (ii) the tie bar 70 is cut by a cutting mold to disconnect the packages from the state in which molded devices are connected.

Thus, the semiconductor device of the QFP package shown in FIG. 9 is manufactured. In the same way, the semiconductor device of the QFN package is also formed.

(6) Step S106

Next, an outer appearance inspecting step is carried out. Here, the semiconductor device is inspected through automatic inspection and visual inspection by a test machine. Whether the semiconductor device is a good product or a defective product is determined and a mark is marked to the defective product. The defective product is removed or transferred to a correcting step.

It would be thought of to carry out the layout design of lead frame for the semiconductor device according to the present embodiment by a computer. As an example of such a computer, a PC (personal computer), a thin client server, a workstation, a mainframe, and a supercomputer are exemplified.

Here, there is a case that a program for the layout design of the lead frame is used for a method of the layout design of lead frame by the computer. Note that the method is not limited to the method of the layout design of the lead frame and may be a method of manufacturing a semiconductor device based on the layout of the lead frame. That is, as a part of the manufacturing apparatus, the computer may be used which carries out the layout design of the lead frame of the semiconductor device.

Although not shown, the above-mentioned computer is achieved by a processor which executes predetermined processing based on the program, a memory which stores the program and various data, and an interface which is used for communication with a network.

As an example of the above-mentioned processor, a CPU (Central Processing Unit), a network processor (NP), a microprocessor, and a microcontroller and so on are exemplified. Or, it may be a semiconductor integrated circuit (LSI: Large Scale Integration) and so on, which have an exclusive use function.

As an example of the above-mentioned memory, the semiconductor memory device such as RAM (Random Access Memory), ROM (Read Only Memory), EEPROM (Electrically Erasable and Programmable Read Only Memory) and a flash memory are exemplified. Also, auxiliary storages such as HDD (Hard Disk Drive) and SSD (Solid State Drive) are exemplified. Also, it may be removable disks such as DVD (Digital Versatile Disk) and storage media such as an SD (Secure Digital) memory card. Also, it may be a buffer and a register and so on. Or, it may be storage units which use DAS (Direct Attached Storage), FC-SAN (Fibre Channel-Storage Area Network), NAS (Network Attached Storage), IP-SAN (IP-Storage Area Network), and so on.

Note that the above-mentioned processor and the above-mentioned memory may be unified. For example, in recent years, the technique of 1-chip microcomputer advances. Therefore, there would be a case that the 1-chip microcomputer mounted on electronic equipment is composed of the above-mentioned processor and the above-mentioned memory.

As an example of the above-mentioned interface, a substrate (motherboard, I/O board) and a semiconductor integrated circuit such as a chip corresponding to a network communication, a network adapter such as NIC (Network Interface Card) and a similar expansion card, communication devices such as an antenna, and communication ports such as a connector are exemplified.

Also, as an example of the network, the Internet, LAN (Local Area Network), wireless LAN (Wireless LAN), WAN (Wide Area Network) and so on are exemplified. Also, it may be backbone, a CATV line, a fixation telephone network, a mobile phone network, WiMAX (IEEE 802.16a), 3G (3rd Generation), dedicated line (lease line), IrDA (Infrared Data Association), Bluetooth (registered trademark), a serial communication line, a data bus and so on.

However, actually, the present invention is not limited to these examples.

<Supplemental Items>

Part or all of the above-mentioned embodiments can be described by the following supplemental items. However, actually, the present invention is not limited to the following specified examples.

[Item 1]

A semiconductor device includes:

a rectangular die pad over which a semiconductor chip is mounted;

a lead group of leads provided for each of four sides of the die pad; and four suspension leads connected with four corners of the die pad, wherein at least one of the four suspension leads is deformed, there are first and second lead groups adjacent to the deformed suspension lead on both side of the deformed suspension lead, and the first and second lead groups correspond to first and second sides of the die pad and the semiconductor chip, and wherein the deformed suspension lead steps out of a virtual diagonal line of the die pad toward the first lead group.

[Item 2]

The semiconductor device according to item 1, wherein a wire bonding region of one lead of the second lead group which is nearest to the deformed suspension lead is located in a free space generated through the bending of the deformed suspension lead.

[Item 3]

The semiconductor device according to item 2, wherein the one lead nearest to the deformed suspension lead in the second lead group is connected with one pad of pads along the first side of the chip.

[Item 4]

The semiconductor device according to item 3, wherein the one lead nearest to the deformed suspension lead in the second lead group is connected with one pad of pads along the first side of the chip, the one pad being second nearest to the second side.

[Item 5]

The semiconductor device according to any of item 1 to 4, wherein the number of pads along the first side is greater than the number of pads along the second side.

[Item 6]

The semiconductor device according to any of item 1 to 5, wherein the one lead nearest to the deformed suspension lead is fixed outwardly by a ring-like tape.

[Item 7]

A semiconductor device includes a die pad, a first suspension lead and a second suspension lead, adjacent to the first suspension lead, of four suspension leads connected with the die pad, a first lead group of leads, a second lead group of leads, a third lead group of leads, a fourth lead group of leads provided for four sides of the die pad, and a semiconductor chip. The die pad has first to fourth sides corresponding to the first to fourth lead groups. The semiconductor chip is mounted above a main surface of the die pad. A first suspension lead is provided to step out of one of virtual diagonal lines of the die pad.

<Remarks>

The embodiments of the present invention have been described in detail. However, actually, the present invention is not limited to the above-mentioned embodiments. A modification in a range which does not deviate from the features of the present invention is contained in the present invention.

What is claimed is:

1. A semiconductor device comprising:
   a semiconductor chip having a main surface over which a plurality of pads is formed;
   a die pad having a top surface over which the semiconductor chip is mounted;
   a plurality of leads;
   a first suspension lead connected with said die pad;
   a plurality of wires electrically connecting the plurality of pads with the plurality of leads, respectively; and
   a resin sealing body sealing the semiconductor chip and the plurality of wires, and having a first side extending along a first direction, a second side extending along a second direction perpendicular to the first direction and a corner portion located between the first side and the second side, wherein the plurality of pads include:
   a first pad group comprised of a plurality of pads arranged along the first direction, and
   a second pad group comprised of a plurality of pads arranged along the second direction, wherein the plurality of leads include:
   a first lead group comprised of a plurality of leads arranged along the first side, and
   a second lead group comprised of a plurality of leads arranged along the second side, wherein the plurality of wires include:
   a first wire electrically connected with a first lead of the first lead group and a first pad of the second pad group,
   a second wire electrically connected with a second lead of the first lead group and a first pad of the first pad group, and
   a third wire electrically connected with a third lead of the first lead group and a second pad of the first pad group, wherein the first suspension lead is extended toward the corner portion, is arranged between the first lead group and the second lead group, and is formed such that a part of the first suspension lead is further from the first lead group than the second lead group in the plan view, wherein the second lead of the first lead group is arranged between the first lead and the third lead of the first lead group, wherein the part of the first suspension is located closer to the first lead of the first lead group than the second lead of the first lead group, and wherein a first distance between the first lead and the second lead of the first lead group is greater than a second distance between the second lead and the third lead of the first lead group in the plan view.

2. The semiconductor-device according to claim 1, wherein a number of all pads of the second pad group arranged along the second direction is greater than a number of all leads of the second lead group arranged along the second side.

3. The semiconductor device according to claim 1, wherein, in the plan view, the part of the first suspension lead is located between the first pad group and the first lead group in the second direction.

4. The semiconductor device according to claim 1, wherein the first distance is in the first direction between a part of the first lead to which the first wire is connected and a part of the second lead to which the first wire is connected, and
   wherein the second distance is in the first direction between the part of the second lead to which the second wire is connected and a part of the third lead to the third wire is connected.

5. The semiconductor device according to claim 1, wherein the second lead is arranged next to the first lead and the third lead.

6. The semiconductor device according to claim 1, wherein a fourth wire of wires electrically connected with a first lead of the second lead group and a second pad of the second pad group,
   wherein the first lead of the second lead group is arranged next to the first suspension lead.

7. The semiconductor device according to claim 1, wherein, in the plan view, the part of the first suspension lead is located between the second pad group and the second lead group in the first direction.

* * * * *